(12) United States Patent
Fried et al.

(10) Patent No.: US 6,750,487 B2
(45) Date of Patent: Jun. 15, 2004

(54) DUAL DOUBLE GATE TRANSISTOR

(75) Inventors: David M. Fried, Ithaca, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,323

(22) Filed: Apr. 11, 2002

(65) Prior Publication Data

US 2003/0193065 A1 Oct. 16, 2003

(51) Int. Cl.[7] ............................................. H01L 29/80
(52) U.S. Cl. .................. 257/270; 257/331; 257/401; 257/74; 257/206
(58) Field of Search ................... 257/618–620, 257/288, 327–329, 331, 333, 347, 401, 365, 366, 74, 206, 246, 250, 270, E21.626, E21.64; 438/270, 271, 587, 588, 284, 286, 128, 129, 193, 195

(56) References Cited

U.S. PATENT DOCUMENTS

| 4,611,184 | A | * | 9/1986 | Kumar | 333/100 |
|---|---|---|---|---|---|
| 5,480,838 | A | | 1/1996 | Mitsui | 438/270 |
| 5,757,038 | A | | 5/1998 | Tiwari et al. | 257/192 |
| 5,780,327 | A | | 7/1998 | Chu et al. | 438/156 |
| 6,097,065 | A | | 8/2000 | Forbes et al. | 257/350 |
| 6,150,687 | A | | 11/2000 | Noble et al. | 257/302 |
| 6,252,284 | B1 | | 6/2001 | Muller et al. | 257/412 |
| 6,396,108 | B1 | * | 5/2002 | Krivokapic et al. | 257/365 |
| 6,458,662 | B1 | * | 10/2002 | Yu | 438/286 |
| 2001/0002715 | A1 | | 6/2001 | Armacost et al. | 257/327 |
| 2001/0006832 | A1 | | 7/2001 | Bae et al. | 438/199 |

FOREIGN PATENT DOCUMENTS

| JP | 1078180 A | 3/1989 |
|---|---|---|
| JP | 1186557 A | 7/1989 |

* cited by examiner

Primary Examiner—Minhloan Tran
Assistant Examiner—Scott R. Wilson
(74) Attorney, Agent, or Firm—Schmeiser, Olsen & Watts; William D. Sabo

(57) ABSTRACT

The present invention provides a dual gate transistor and a method for forming the same that results in improved device performance and density. The present invention uses a double gate design to implement a dual gate transistor. A double gate is a gate which is formed on both sides of the transistor body. The present invention thus provides a transistor with two double gates in series that provide improved current control over traditional dual gate designs. The preferred embodiment of the present invention uses a fin type body with dual double-gates. In a fin type structure, the double gates are formed on each side of a thin fin shaped body, with the body being disposed horizontally between the gates.

18 Claims, 11 Drawing Sheets

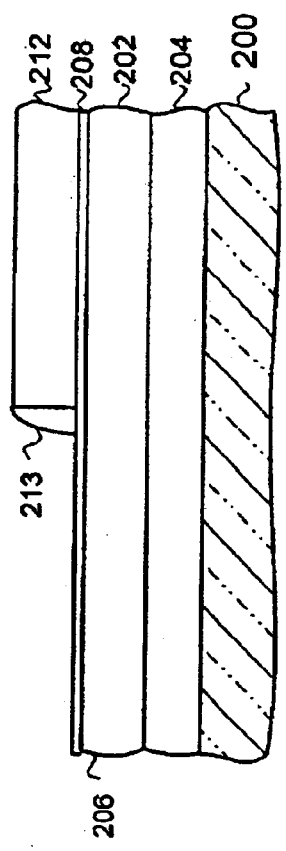
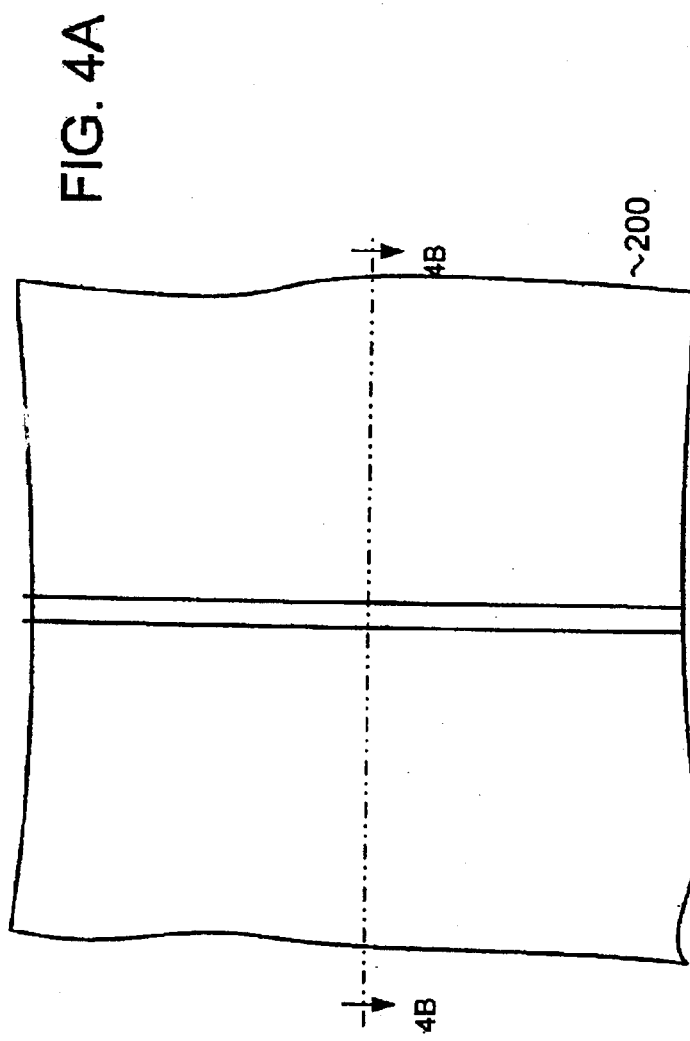

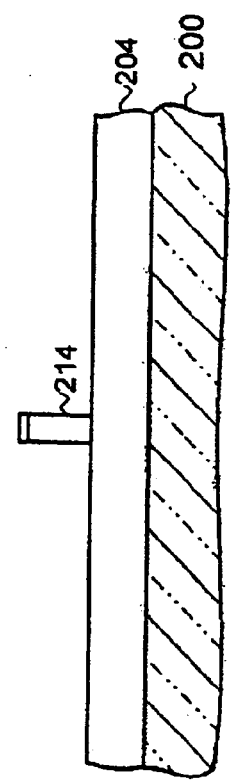
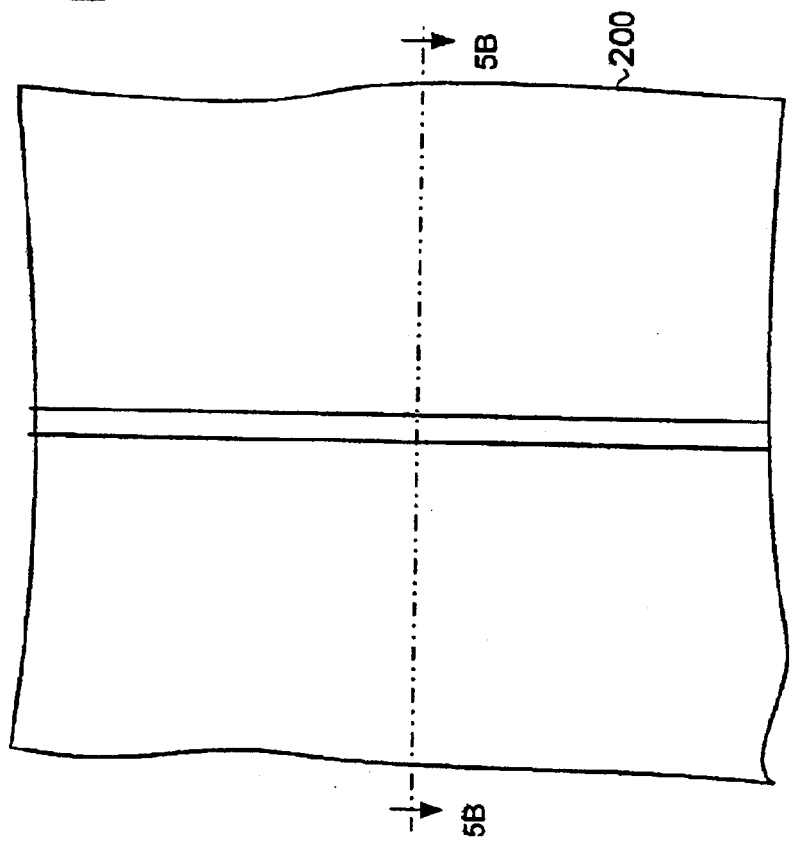

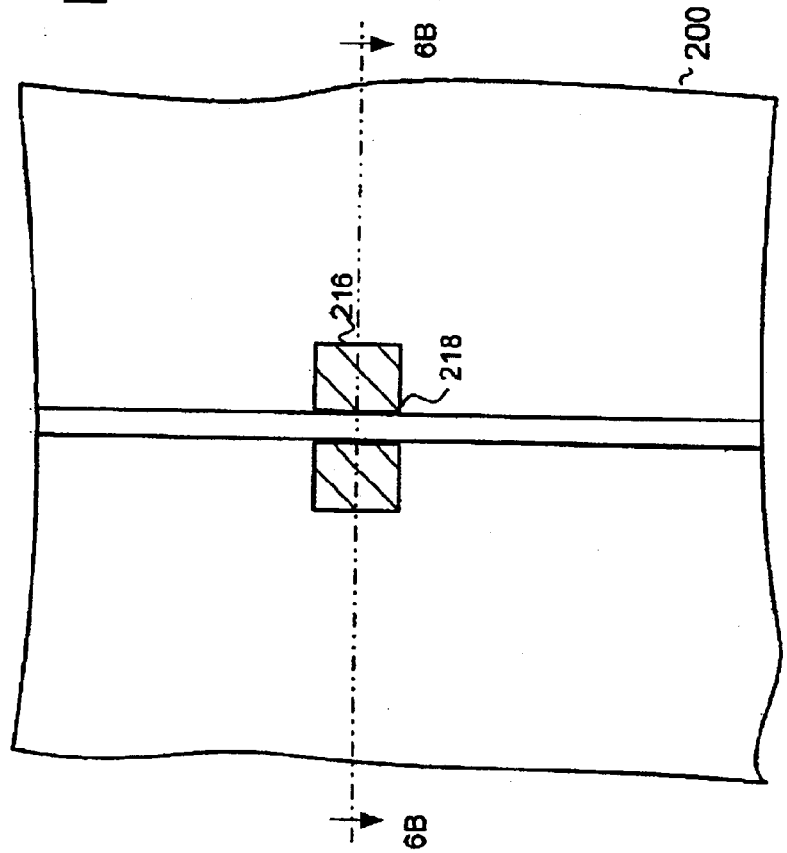
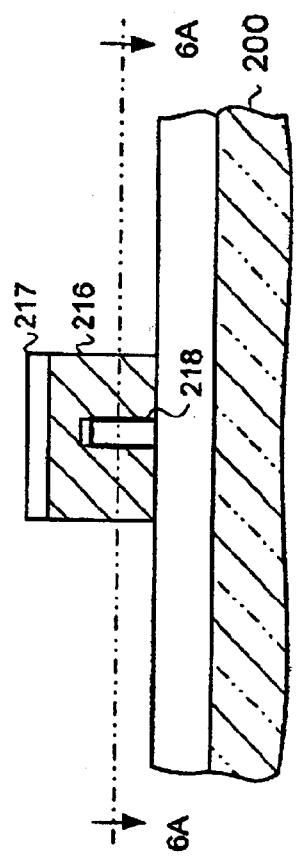
FIG. 6A
FIG. 6B

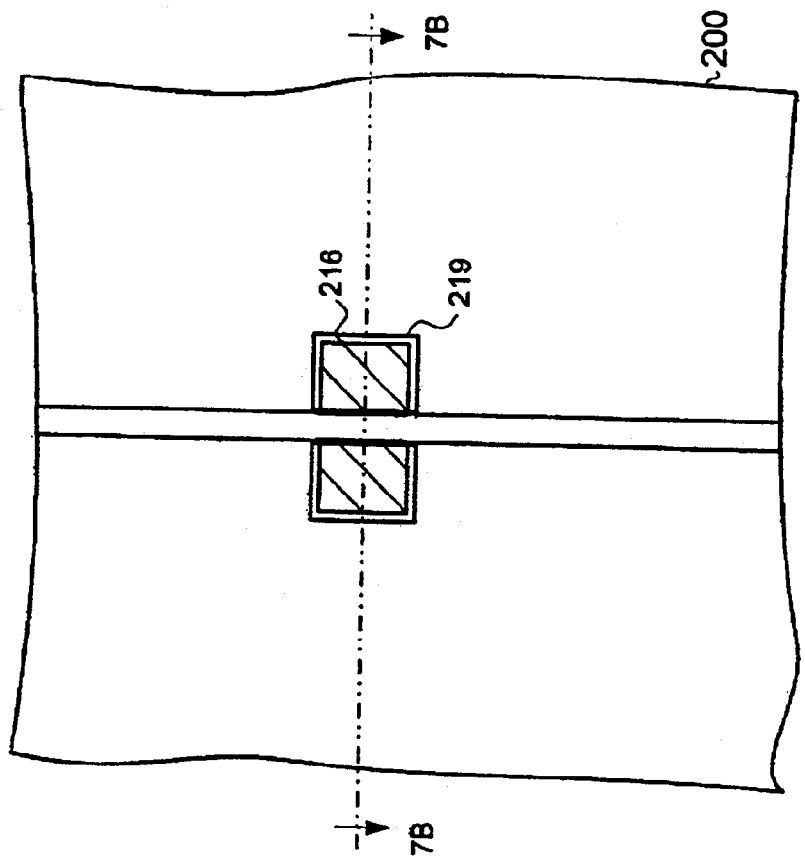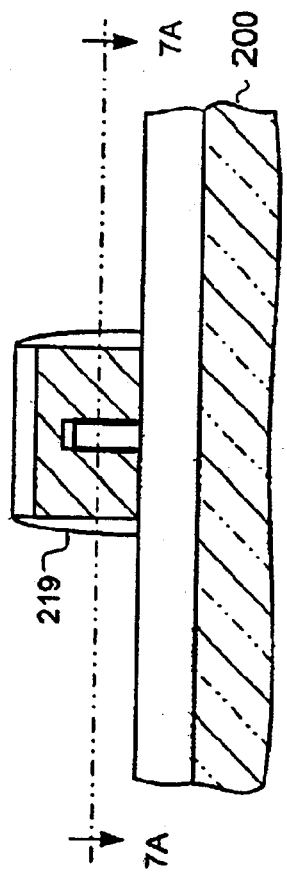

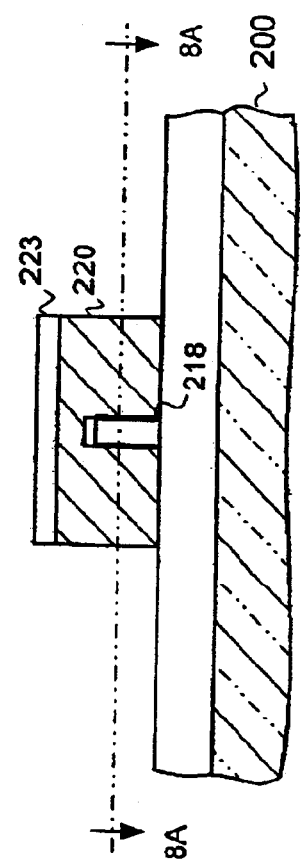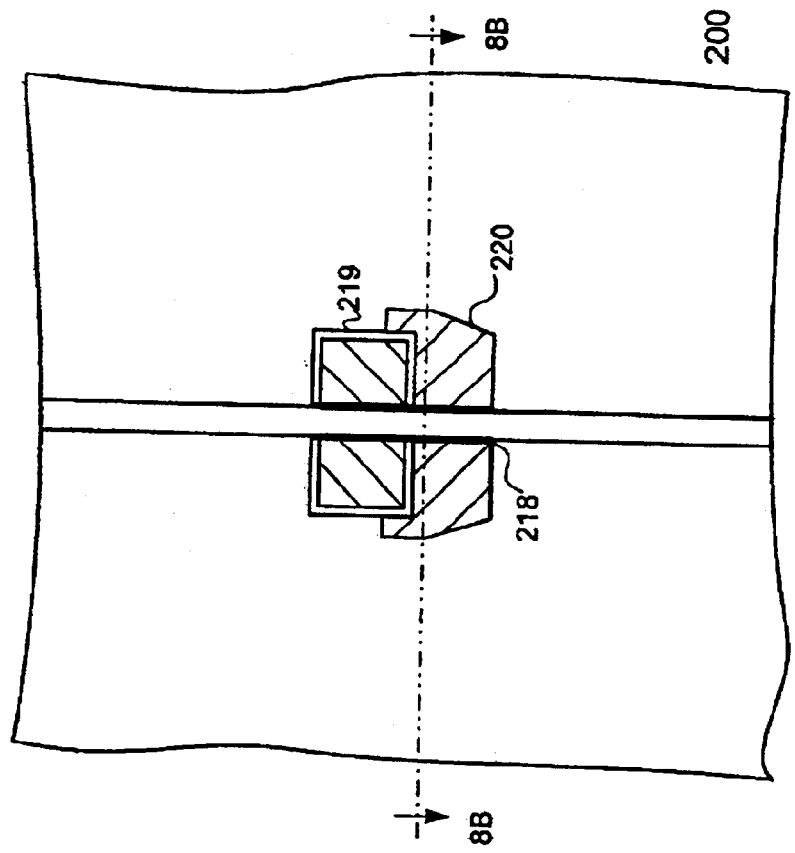

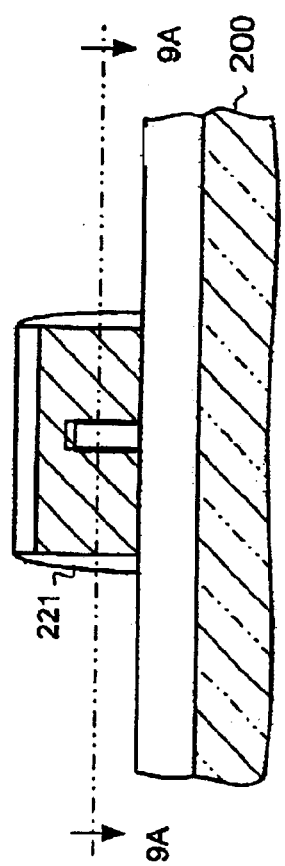
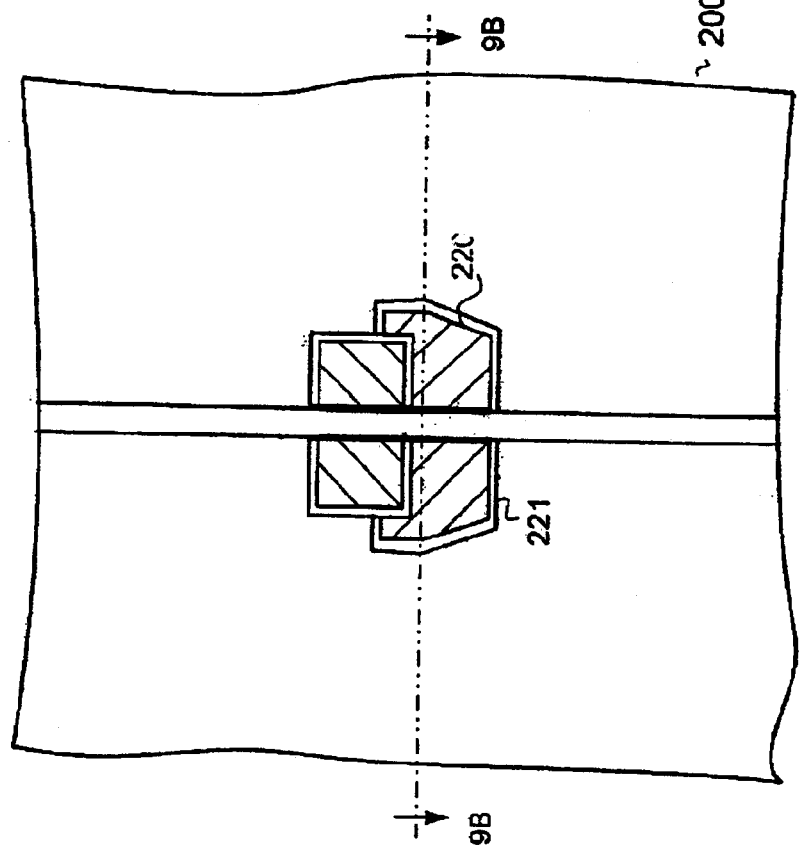
FIG. 9A
FIG. 9B

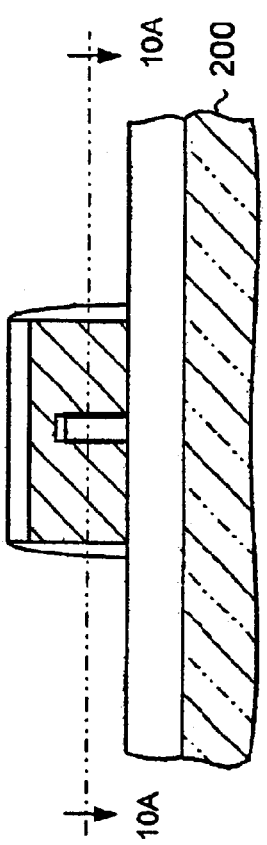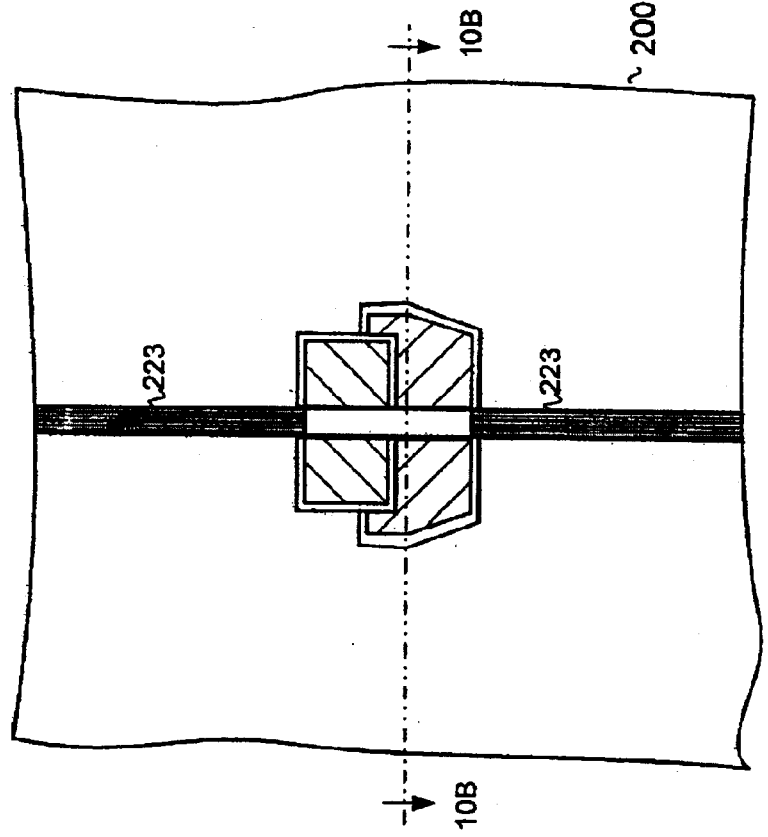

DUAL DOUBLE GATE TRANSISTOR

BACKGROUND OF THE INVENTION

Technical Field

The present invention relates generally to the field of semiconductor manufacturing and, more specifically, to a method for forming double gated field effect transistors.

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) Unfortunately, increased device density in CMOS FET can result in degradation of performance and/or reliability.

One type of FET that is used in many different applications is a dual gate FET. A dual gate FET has two separate gates in series that are used to control the operation of the FET. For example, in a dual gate NFET, both gates must be high for the transistor to be on. If either gate is low, the transistor does not turn on. Likewise, in a dual gate PFET, both gates must be low for the transistor to be on. If either gate is high, the transistor will not turn on.

Dual gate FETs have many different uses today. Dual gate FETs are used in logic operations, effectively providing a logical NAND operation with one device. Dual gate FETs are also commonly used in radio frequency application where the dual gate structure can be used to provide additional isolation between the drain and the gate. This reduces the possibility of capacitive feedback from the drain back to the gate, and thus improves operation of the device.

Unfortunately, several difficulties arise in the design and fabrication of dual gate transistors. For example, it has been difficult to design dual gate transistors with sufficient device density and current control ability when compared to single gate transistors. This has limited their application to low performance applications.

Thus, there is a need for improved device structures and methods of fabrications of dual gate devices that provide improved device performance and device density.

BRIEF SUMMARY OF THE INVENTION

Accordingly, the present invention provides a dual gate transistor and a method for forming the same that results in improved device performance and density. The present invention uses a double gate design to implement a dual gate transistor. A double gate is a gate which is formed on both sides of the transistor body. The present invention thus provides a transistor with two double gates in series that provide improved current control over traditional dual gate designs. The preferred embodiment of the present invention uses a fin type body with dual double-gates. In a fin type structure, the double gates are formed on each side of a thin fin shaped body, with the body being disposed horizontally between the gates.

In another aspect of the invention, the dual double gates are provided with offset gaps between the double gates. The offset of the gaps allows the size of the gaps to be increased, reducing gate to gate capacitance, while still providing exceptional current control.

The foregoing and other advantages and features of the invention will be apparent from the following more particular description of a preferred embodiment of the invention, as illustrated in the accompanying drawings.

BRIEF DESCRIPTION OF THE SEVERAL VIEWS OF THE DRAWINGS

The preferred exemplary embodiment of the present invention will hereinafter be described in conjunction with the appended drawings, where like designations denote like elements.

FIGS. 3–10 are top and cross-sectional side views of an exemplary dual double gate transistor during fabrication.

DETAILED DESCRIPTION OF THE INVENTION

The present invention provides a dual gate transistor and a method for forming the same that results in improved device performance and density. The present invention uses a double gate design to implement a dual gate transistor. A double gate is a gate which is formed on both sides of the transistor body. The present invention thus provides a transistor with two double gates in series that provide improved current control over traditional dual gate designs. The preferred embodiment of the present invention uses a fin type body with dual double-gates. In a fin type structure, the double gates are formed on each side of a thin fin shaped body, with the body being disposed horizontally between the gates.

In another aspect of the invention, the dual double gates are provided with offset gaps between the double gates. The offset of the gaps allows the size of the gaps to be increased, reducing gate to gate capacitance, while still providing exceptional current control.

Figure 1:
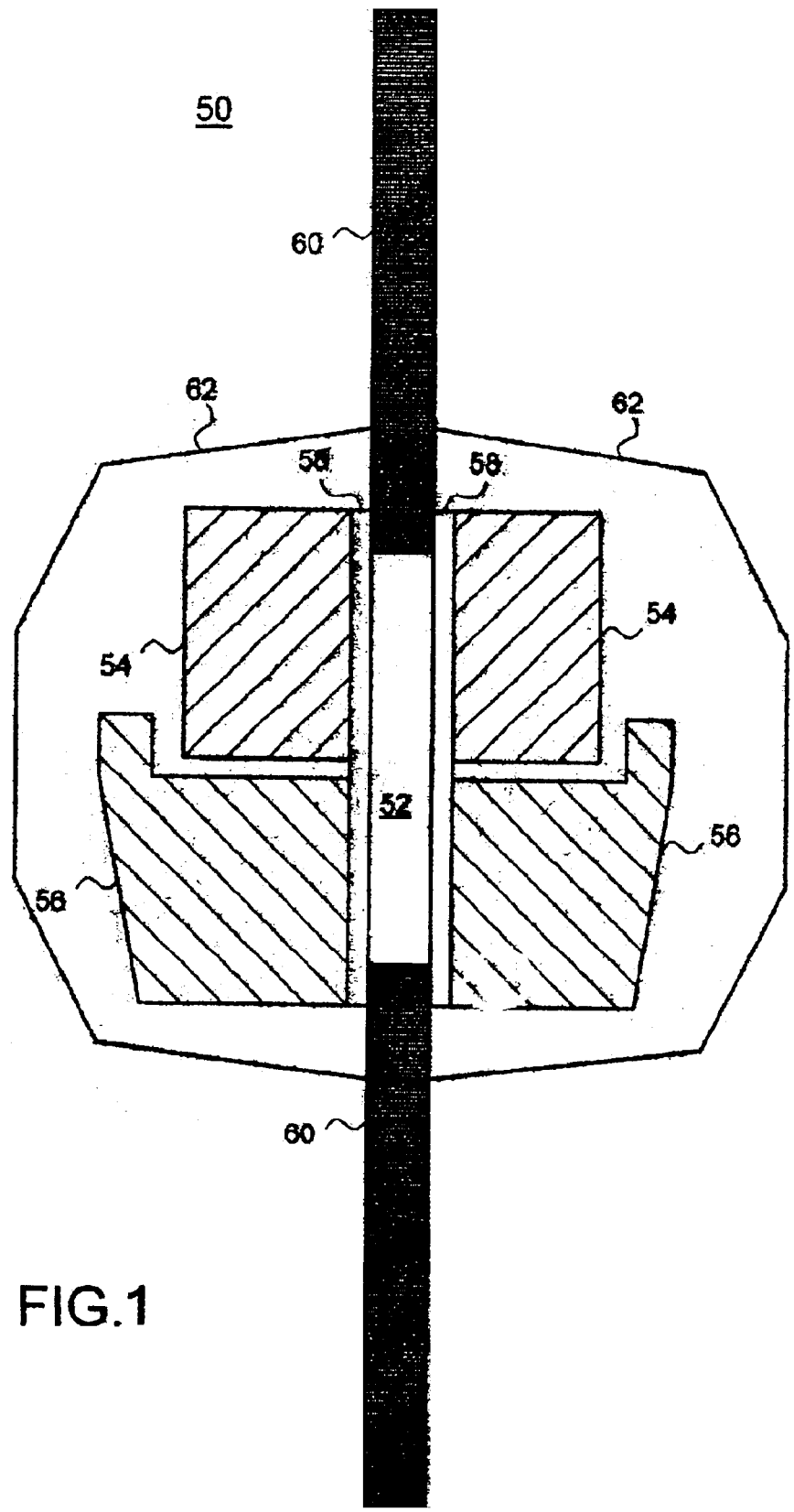
FIG. 1 is a top cross sectional view of a dual double-gate transistor.

Turning now to FIG. 1, a top sectional view of an dual double gate transistor 50 is shown. The dual double gate transistor 50 includes a body 52, a first gate 54, a second gate 56, gate dielectrics 58, source/drains 60 and spacers 62. The transistor 50 is a dual double gate transistor because both the first gate 54 and the second gate 56 are formed on two sides of the body 52. Specifically, a first portion of gate 54 is formed on one side of the body 52, and a second portion of gate 54 is formed on another side of body 52. Likewise, a first portion of gate 56 is formed on one side of the body 52, and a second portion of the gate 56 is formed on another side.

The dual double gate transistor 50 is a fin transistor, meaning that the transistor body is from a thin upright portion of semiconductor and thus has a "fin" type shape. In a fin transistor, the gate(s) are formed on the side(s) of the fin body and the source and drain are formed at the ends of the fin body. In a fin-type body, the fin is generally narrow enough to allow the channel to become fully depleted during operation. It should be noted that as this is a cross sectional view, the top portions of gates 54 and 56 are not shown. Typically, both halves of each gate are connected at the top of the transistor, although the two gates are not connected to each other.

The dual double gate transistor 50 is formed such that a first gate and the second gate are in series. Thus, where the transistor is a NFET both gates would have to be high to turn on the transistor and where the transistor is a PFET both gates would have to be low. This allows the transistors to implement logic functions such as a logical NAND operation. It also allows for increased drain-to-gate isolation by setting an intervening gate at a fixed voltage level.

One key parameter of the dual double gate transistor 50 is the separation between the first gate 54 and the second gate 56. Generally, it is desirable to provide sufficient distance between the gates to assure that capacitance between the gates is minimized. However, the amount of a distance should not be so great as to create a large "dead" space, with no gate coverage, in the middle of the transistor body. As will be discussed with reference to FIG. 11, a second embodiment is also provided that provides that mitigates the need for placing the gates close together to prevent dead space.

Figure 2:
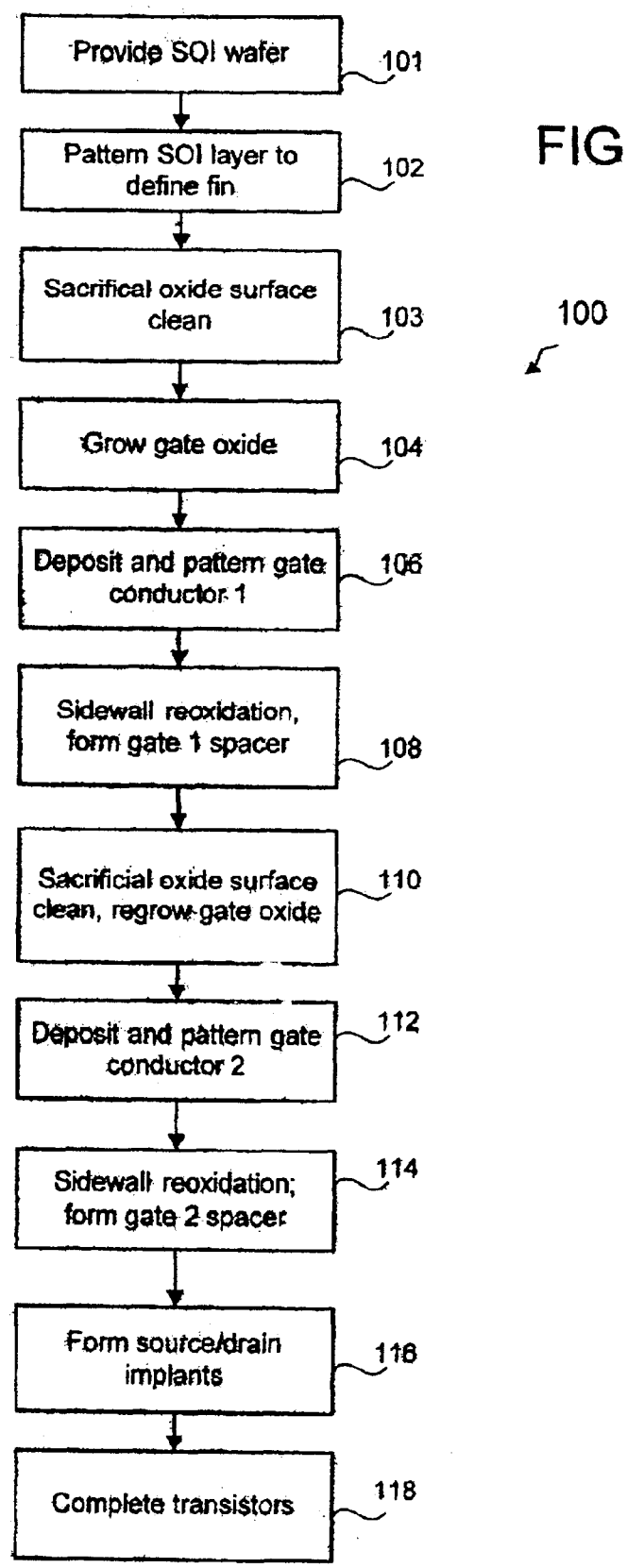
FIG. 2. is a flow diagram illustrating a fabrication method.

Turning now to FIG. 2, a method 100 for forming a dual double gated transistor in accordance with the preferred embodiment is illustrated. As will become clear, method 100 can be used to form a fin type dual double gated transistor similar to that illustrated in FIG. 1. An example of a transistor being formed with method 100 will be illustrated in FIGS. 2–10. Of course, those skilled in the art will recognize that the principles of the present invention apply to other designs and methods for fabrication. For example, the method will be described with the reference to the formation of a fin type transistor, and those skilled in the other will recognize that it can be applied to the formation of a other types of double gate transistors, such as planar double gate transistors.

The first step 101 of method 100 is to provide an appropriate wafer. In the preferred embodiment, the wafer used comprises a silicon on insulator (SOI) wafer. As such, the wafer comprises a buried oxide layer beneath an SOI layer. As will become clear, the SOI layer is used to form the body of the double gated transistor. As such, it is generally preferable to use a SOI layer that has a p-type (for NFETs) doping density in the range of $1 \times 10^{18}$ cm$^{-3}$ to $8 \times 10^{18}$ cm$^{-3}$ to provide proper centering and control of the threshold voltage of the transistor. In other cases, the proper doping will be provided later using an appropriate implant into the fin. However, non-SOI wafers can be used. When a non-SOI wafer is used, the processing remains otherwise identical to those of the SOI wafer case, except as noted.

Figure 3A:
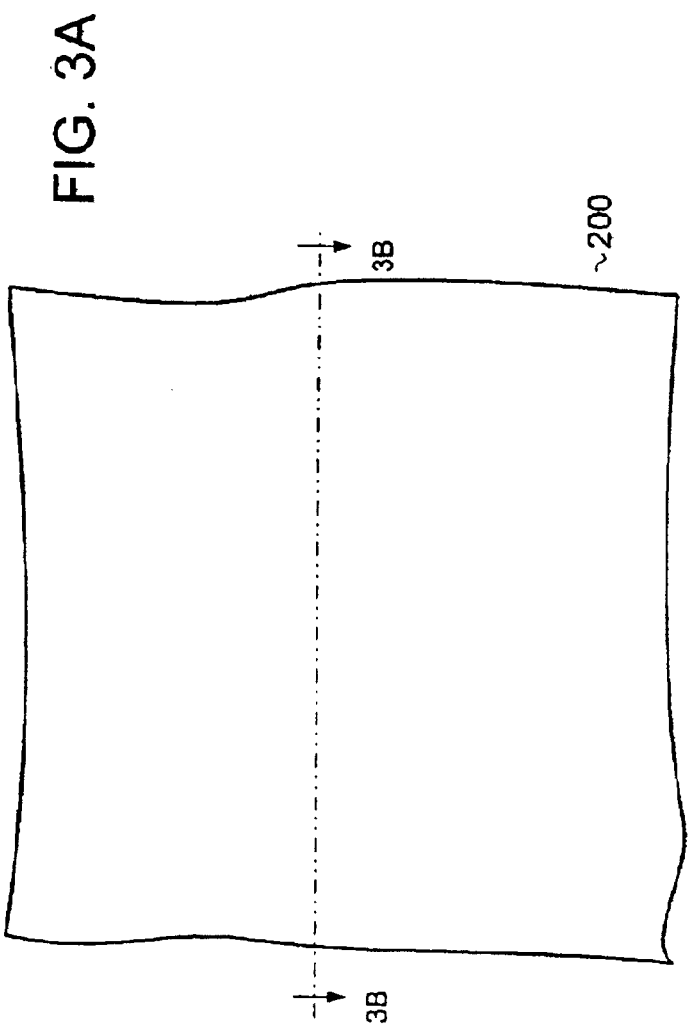
Figure 3B:
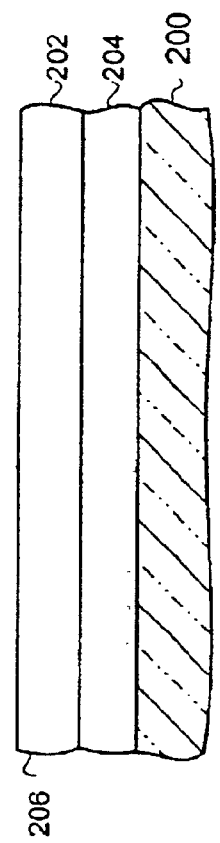

Turning now to FIGS. 3A and 3B, a wafer portion 200 is illustrated. FIG. 3A illustrates a top view of the wafer portion 200, and FIG. 3B illustrates cross-sectional side views taken at line 3B. The preferred embodiment wafer portion 200 comprises an SOI wafer, and as such includes an SOI layer 202 and a buried oxide layer 204.

to FIG. 2, the next step 102 is to pattern the SOI layer to define the fin. When forming fin type transistors, it is generally desirable to have the fin thickness narrow when compared to the gate length. Typically, the fin thickness should be less than one quarter of the gate length to give good threshold voltage control. Also, it is generally desirable that the fin thickness should be greater than 2.5 nm to avoid degraded mobility due to quantum confinement issues. As the gate length is generally made to minimum feature size, image enhancement techniques are desirable to achieve a fin width of subminimum feature size. One such image enhancement technique is sidewall image transfer.

Sidewall image transfer typically involves the formation of a mandrel layer and at least one etch stop layer. The mandrel layer is then patterned to define shapes such that the exterior perimeter of the shapes will provide the sidewalls used to define the fin. The mandrel layer preferably comprises a layer of oxide, nitride or other suitable material. Generally it will be desirable for the mandrel layer to have a thickness of between 10 nm and 100 nm, however, such a thickness may change depending on the desired body thickness.

Sidewall spacers are then formed on the sidewalls of the patterned mandrel layer. The sidewall spacer can be formed using a deposition of silicon nitride or other suitable material, followed by a suitable directional etch.

The SOI layer is then etched selective to the sidewall spacer to define the fin. This can be done using any suitable etch that is selective to the sidewall spacer. This etch transfers the trimmed sidewall spacer image into the SOI layer, and thus completes the sidewall image transfer. This is preferably done by using a reactive ion etch that etches the SOI layer selective to the sidewall spacers and stops on the buried insulator layer.

Sidewall image transfer provides many advantages, the most notably being that it allows features to be accurately fabricated below the minium lithographic feature size. Specifically, because sidewall image transfer is used to define the fins, the fins of the transistor can be accurately formed with a narrower width than could be formed using traditional lithography.

Turning now to FIGS. 4A and 4B, a wafer portion 200 is illustrated after an etch stop layer 208 and a mandrel layer 212 has been formed on the SOI layer 202, mandrel layer 212 has been patterned, and a sidewall spacer 213 formed on the edge of the mandrel layer 212. FIG. 4A illustrates a top view of the wafer portion 200, and FIG. 4B illustrates cross-sectional side views taken at line 4B. Turning now to FIGS. 5A and 5B, a wafer portion 200 is illustrated after the sidewall spacer 213 has been used to etch the SOI layer 202 to form a fin body 214. Again, because the fin body 214 has been defined using sidewall image transfer, it can accurately formed with a subminimum feature width.

Returning to FIG. 2, the next step 103 is to perform a sacrificial oxide process to clean the exposed sides of the fin. This would typically involve growing a thin layer of thermal oxide and then removing the oxide. This process removes defects in areas of the fin that were damaged by the patterning process, and prepares it for the formation of the gate dielectric.

In some cases it will be desirable to perform a ion implant into the body at this time. Generally, an ion implant is performed after the oxide has been grown but before it is removed. This ion implant serves to properly dope the fin channel region. In other cases, the fin channel is doped in situ during the formation of the fin material.

The next step 104 is to provide gate oxide or other dielectric on the exposed surfaces of the silicon by either thermal oxidation of the exposed silicon or deposition of silicon dioxide or high k dielectric. This process forms gate dielectric on both sides of the fin. The next step 106 is to deposit and pattern a first gate conductor material. This deposition and patterning forms the first of the two double gates.

The gate conductor can be any suitable conductive material such as doped polysilicon or tungsten. Generally, the gate conductor material is deposited over the fin, planerized, an insulator layer deposited, and then the gate conductor is patterned using a suitable lithographic process. The insulator layer formed on the first gate conductor will serve to isolate the first gate conductor from the second gate conductor.

Additionally, the insulator layer can be used as a hardmask during the patterning of the first gate conductor.

Turning now to FIGS. 6A and 6B, the wafer portion 200 is illustrated after the forming of a gate dielectric, the deposition of a first gate conductor, the deposition and patterning of an insulator layer, and the patterning of the first gate conductor. FIG. 6A illustrates a cross-sectional top view of the wafer portion 200 taken at line 4A, and FIG. 6B illustrates cross-sectional side views taken at line 4B. The deposition and patterning of the first gate conductor forms insulator layer 217 and a first gate 216 over the gate dielectric 218. The insulator layer 217 covers the first gate 216, and will be used to isolate the first gate 216.

Returning to FIG. 2, the next step 108 is to perform sidewall reoxidation and form a first gate spacer. The sidewall reoxidation serves to remove damage from the sides of the fin that may have occurred during the patterning of the first gate structure. The formation of the first gate spacer provides the needed isolation between the first gate and the later formed second gate. The first gate spacer can be formed by the conformal deposition and directional etch of a suitable dielectric, such as silicon oxide or nitride. This forms the gate spacer on the sidewalls of the first gate.

Generally, the first gate spacer should be constructed exclusively on the gate, and not on the sides of the fin. This can be accomplished using a method such as described in U.S. Pat. No. 5,793,082, issued to Bryant, and assigned to International Business Machines, Inc. In this method, a dielectric material is deposited over the entire wafer and planerized to a level where the top of the gate is exposed. A selective etch is next used to recess the dielectric below the top of the gate, typically 5 nm to 20 nm. Next, a nitride spacer is formed on the exposed edges of the gate and subsequently used as a mask to etch the deposited dielectric, thereby forming a spacer adjacent to the gate edge only.

Turning now to FIGS. 7A and 7B, the wafer portion 200 is illustrated after a first gate spacer 219 has been formed around the first gate 216.

Returning to FIG. 2, the next step 110 is to again perform a sacrificial oxide process to clean the exposed sides of the fin, and to regrow the gate oxide. The sacrificial oxide process again involves the growing of a thin layer of thermal oxide and then removing the oxide. This process removes defects in areas of the fin that were damaged by the patterning process, and prepares it for the formation of the oxide. The gate oxide can then be regrown using a suitable thermal oxidation process. This provides the needed gate dielectric on both sides of the fin in preparation for the formation of the second gate.

In some cases it will again be desirable to perform a ion implant into the body at this time. Generally, this ion implant would be performed after the oxide has been grown but before it is removed. This ion implant serves to separately adjust the channel threshold voltage for the second gate in cases where that is desirable.

The next step 112 is to deposit and pattern the second gate conductor. This deposition and patterning forms the second of the two double gates. Again, the gate conductor can be any suitable conductive material such as doped polysilicon or tungsten. Generally, the second gate conductor material is deposited over the fin, planerized, a hardmask deposited and patterned using a suitable lithographic process, and then patterning the second gate conductor. The previously formed first gate spacer and first insulator layer provides the isolation between the first gate and the second gate.

Turning now to FIGS. 8A and 8B, the wafer portion 200 is illustrated after the reforming of a gate dielectric and the deposition and patterning of a second gate conductor. The deposition and patterning of the first gate conductor forms a second gate 220 over the reformed gate dielectric 218. A portion of the hardmask layer 223 remains over the top of the second gate 220. The previously formed first gate spacer 219 and insulator layer 217 provides the isolation between the first gate 216 and the second gate 220.

Returning to FIG. 2, the next step 114 is to perform a sidewall reoxidation and then form a second gate spacer. The sidewall reoxidation again serves to clean the sides of the fin that may have been damaged during the patterning of the first gate structure. The formation of the second gate spacer isolates the second gate. The second gate spacer can be formed by the conformal deposition and directional etch of a suitable dielectric, such as silicon nitride.

Turning now to FIGS. 9A and 9B, the wafer portion 200 is illustrated after a second gate spacer 221 has been formed around the exposed edges of the second gate 220.

Returning to FIG. 2, the next step 116 is to form source/drain implants into the exposed outer portions of the fin. This is preferably done by performing an angled implant into the source and drain regions of the fin. The angled implants preferably comprise arsenic for n-type FETs or boron difluoride for p-type FETs, tilted between 45 degrees and 75 degrees from a ray normal to the plane of the wafer. The doses and energies of the these implants preferably range from between $2 \times 10^{14}$ to $1 \times 10^{15}$ cm−2 at 0.5 to 5 keV. Turning now to FIG. 10A and In some cases it will again be desirable to perform a ion implant into the body at this time. Generally, this ion implant would be performed after the oxide has been grown but before it is removed. This ion implant serves to separately adjust the channel threshold voltage for the second gate in cases where that is desirable.

The next step 112 is to deposit and pattern the second gate conductor. This deposition and patterning forms the second of the two double gates. Again, the gate conductor can be any suitable conductive material such as doped polysilicon or tungsten. Generally, the second gate conductor material is deposited over the fin, planerized, a hardmask deposited and patterned using a suitable lithographic process, and then patterning the second gate conductor. The previously formed first gate spacer and first insulator layer provides the isolation between the first gate and the second gate.

Turning now to FIGS. 8A and 8B, the wafer portion 200 is illustrated after the reforming of a gate dielectric and the deposition and patterning of a second gate conductor. The deposition and patterning of the first gate conductor forms a second gate 220 over the reformed gate dielectric 218. A portion of the hardmask layer 223 remains over the top of the second gate 220. The previously formed first gate spacer 219 and insulator layer 217 provides the isolation between the first gate 216 and the second gate 220.

Returning to FIG. 2, the next step 114 is to perform a sidewall reoxidation and then form a second gate spacer. The sidewall reoxidation again serves to clean the sides of the fin that may have been damaged during the patterning of the first gate structure. The formation of the second gate spacer isolates the second gate. The second gate spacer can be formed by the conformal deposition and directional etch of a suitable dielectric, such as silicon nitride.

Turning now to FIGS. 9A and 9B, the wafer portion 200 is illustrated after a second gate spacer 221 has been formed around the exposed edges of the second gate 220.

Returning to FIG. 2, the next step 116 is to form source/drain implants into the exposed outer portions of the fin. This is preferably done by performing an angled implant into the source and drain regions of the fin. The angled implants preferably comprise arsenic for n-type FETs or boron difluoride for p-type FETs, tilted between 45 degrees and 75 degrees from a ray normal to the plane of the wafer. The doses and energies of the these implants preferably range from between $2\times1014$ to $1\times1015$ cm$-2$ at 0.5 to 5 keV. Turning now to FIGS. 10A and 10B the wafer portion 200 is illustrated after the formation of source/drain implants 223 into the fin body.

Returning to FIG. 2, the last step 118 is to complete the transistors. This would typically include the formation of contacts and any interconnect processing. These contacts would typically include source and drain contacts, and contacts to both the first gate and the second gate. Contacts to the first and second double gates allow the two double gates to receive control signals and be independently activated to control the operation of the transistor.

Method 100 thus provides a method for the fabrication dual double gated transistors that provides a dual gate transistor with improved density and performance.

Figure 11:
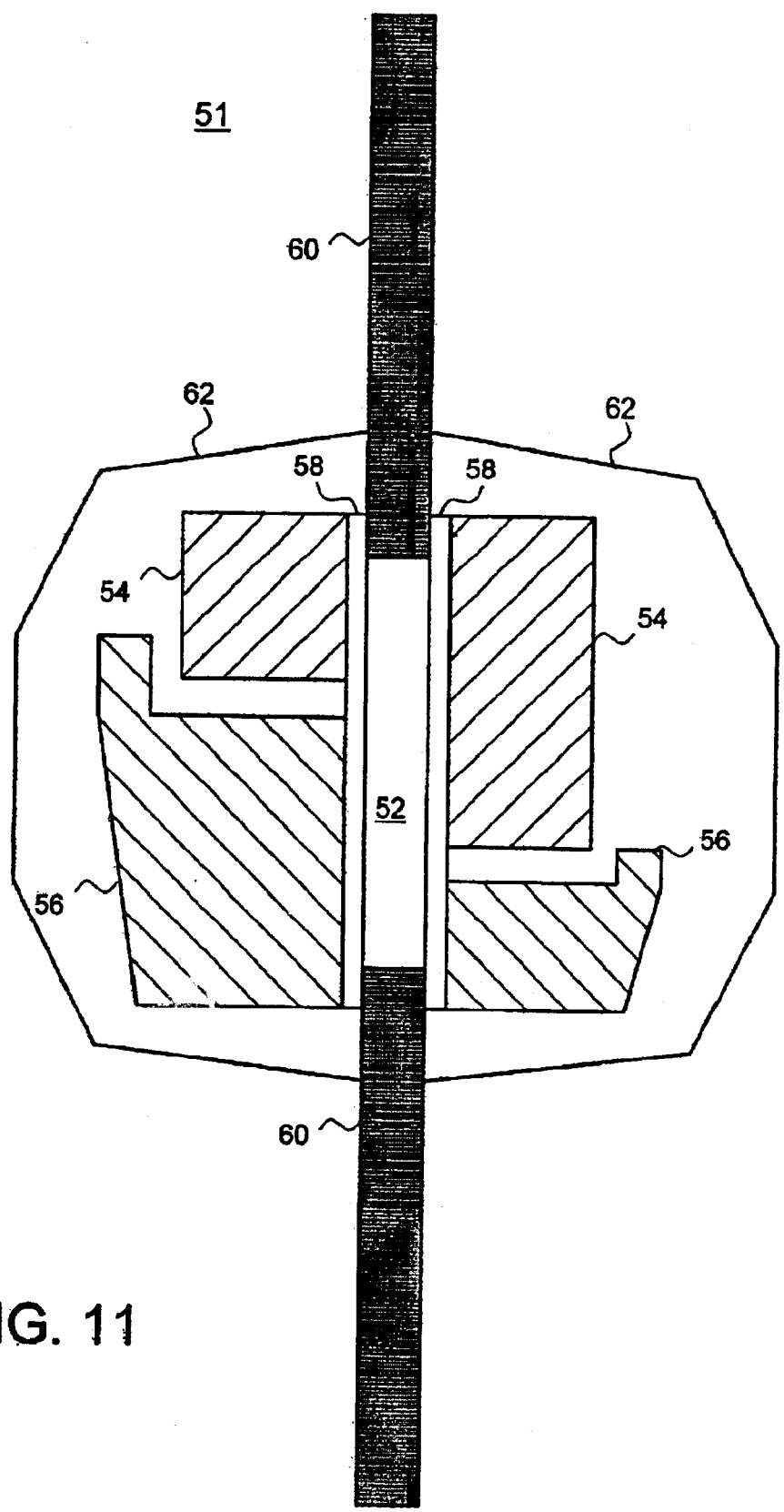
FIG. 11 is a top schematic view of a dual double-gate transistor with offset gates.

Turning now to FIG. 11, top sectional view of a second embodiment of the dual double gated transistor is illustrated. The dual double gate transistor 51 includes a body 52, a first gate 54, a second gate 56, gate dielectrics 58, source/drains 60 and spacers 62. The transistor 51 is a dual double gate transistor because both the first gate 54 and the second gate 56 are formed on both sides of the body 52. Again, it should be noted that as this is a cross sectional view, the top portions of gates 54 and 56 are not shown. Typically, both halves of each gate are connected at the top of the transistor, although the two gates are not connected to each other.

As stated before, one key parameter of the double gate transistor is the separation between the first gate 54 and the second gate 56. Generally, it is desirable to provide sufficient distance between the gates to assure that capacitance between the gates is minimized. However, the amount of a distance should not be so great as to create a large "dead" space, with no gate coverage, in the middle of the transistor body. The second embodiment transistor 51 mitigates the problem of dead space by offsetting the space between the gates such that they do not line up across the fin. In particular, because the space is offset, there is no location in the body 52 of the transistor that is not adjacent to either the first gate or the second gate. Because the body is thin in a fin transistor, the single half the gate can provide a sufficient current channel for reliable operation. Because the problem with dead space has been mitigated, the space between the first gate 54 and the second gate 56 can be larger, reducing the capacitance between the gates.

The dual double gate transistor 51 can be formed using method 100 by forming the first gate at a non-perpendicular angle with respect to the fin. By patterning one edge of the first gate at an angle other than 90 degrees, preferably between 45 and 60 degrees, the gate on one side of the body will extend between 1.4 and 2 times the body thickness beyond the gate on a second side. Thus, when the second gate is formed, the second gate on the second side will overlap, within one body thickness, the first gate on the first side of the body, ensuring good continuity of control of the body potential by the gates, collectively.

It should also be noted that the gate electrodes on opposing sides of the transistor body may be either of the same material, such as n-type polysilicon, p-type polysilicon, tungsten, titanium nitride, rhenium, or other conductors or of differing materials selected from a similar list. The second gate electrode pair may also be of materials different from those comprising the first gate electrode pair. When such dissimilar materials are used in the first gate or in the second gate, that side of the gate with material properties which render it more attractive to the dominant charge carriers (e.g. n+ polysilicon versus p+ polysilicon for an n-type FET constructed of asymmetrically doped polysilicon gates) is referred to as the strong gate while that side of the gate which is less attractive to the channel carriers is referred to as the weak gate. In the case when dissimilar materials comprise the first gate electrode pair and furthermore, dissimilar materials comprise the second gate electrode pair, it is generally favorable to construct the dual-double-gate transistor with a portion of the strong gate side of the first gate directly opposite the body from a portion of the strong gate side of the second gate.

The present invention provides a dual gate transistor and a method for forming the same that results in improved device performance and density. The present invention uses a double gate design to implement a dual gate transistor. A double gate is a gate which is formed on both sides of the transistor body. The present invention thus provides a transistor with two double gates in series that provide improved current control over traditional dual gate designs. The preferred embodiment of the present invention uses a fin type body with dual double-gates. In a fin type structure, the double gates are formed on each side of a thin fin shaped body, with the body being disposed horizontally between the gates.

While the invention has been particularly shown and described with reference to an exemplary embodiment using a fin type double gated field effect transistor, those skilled in the art will recognize that the preferred embodiment can be applied to other types of double gated transistors, and that changes in implementation details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

What is claimed is:

1. A semiconductor device comprising:
  a) a source, a drain and a body between the source and the drain, the body having a first side and a second side;
  b) a first double gate, the first double gate having a first portion adjacent to the body first side and a second portion adjacent to said body second side; and
  c) a second double gate, the second double gate having a first portion adjacent to the body first side and a second portion adjacent to said body second side, the first portion of the first double gate having a surface that is coplanar with a surface of the first portion of the second double gate, the second portion of the first double gate having a surface that is coplanar with a surface of the second portion of the second double gate.

2. The semiconductor device of claim 1 wherein the body comprises a fin body that has a width narrow enough to insure a fully depleted channel during operation of the transistor.

3. The semiconductor device of claim 1 wherein the first double gate receives a first control signal and said second double gate receives a second control signal.

4. The semiconductor device of claim 1 wherein the body comprises a portion of a silicon-on-insulator layer.

5. The semiconductor device of claim 1 further comprising an insulating spacer between the first double gate and the second double gate.

6. The semiconductor device of claim 1 wherein the first body side and the second body side are on opposite sides of the body.

7. A semiconductor device comprising:
- a source, a drain and a body between the source and the drain, the body having a first side and a second side;
- a first double gate, the first double gate having a first portion adjacent to the body first side and a second portion adjacent to said body second side;
- a second double gate, the second double gate having a first portion adjacent to the body first side and a second portion adjacent to said body second side;
- a first insulating spacer between the first portion of the first double gate and the first portion of the second double gate; and
- a second insulating spacer between the second portion of the first double gate and the second portion of the second double gate.

8. The semiconductor device of claim 7 wherein the first insulating spacer and second insulating spacer are formed offset such that the first insulating spacer and second insulating spacer are not inline across the body.

9. The semiconductor device of claim 7, wherein the body comprises a fin body that has a width narrow enough to insure a fully depleted channel during operation of the transistor.

10. The semiconductor device of claim 7, wherein the first double gate receives a first control signal and said second double gate receives a second control signal.

11. The semiconductor device of claim 7, wherein the body comprises a portion of a silicon-on-insulator layer.

12. The semiconductor device of claim 7, wherein the first body side and the second body side are on opposite sides of the body.

13. A transistor comprising:
- a) a fin body formed on a substrate, the fin body having a first vertical edge and a second vertical edge, and a first end and a second end;
- b) a source formed at the first end of the fin body, and a drain formed at the second end of the fin body;
- c) a first gate structure adjacent the transistor body first vertical edge and second vertical edge, the first gate structure approximate to the source;
- d) a second gate structure adjacent the transistor body first vertical edge and second vertical edge, the second gate structure approximate to the drain; and
- e) a spacer between the first gate structure and the second gate structure, wherein the portion of the spacer adjacent to the first vertical edge is offset from the portion of the spacer adjacent to the second vertical edge.

14. The transistor of claim 13, wherein the fin body has a width narrow enough to insure a fully depleted channel during operation of the transistor.

15. A transistor comprising:
- a) a fin body formed on a substrate, the fin body having a first vertical edge and a second vertical edge, and a first end and a second end;
- b) a source formed at the first end of the fin body, and a drain formed at the second end or the fin body;
- c) a first gate structure adjacent the transistor body first vertical edge and second vertical edge, the first gate structure approximate to the source; and
- d) a second gate structure adjacent the transistor body first vertical edge and second vertical edge, the second gate structure approximate to the drain, wherein a portion of the first gate structure adjacent to the first vertical edge of the transistor body is directly opposite a portion of the second gate structure adjacent to the second vertical edge of the transistor body.

16. The transistor of claim 15 wherein the first gate structure adjacent to the first vertical edge off the transistor body has a work function which is more attractive to dominant charge carriers of the transistor compared to that of the first gate structure adjacent to the second vertical edge of the transistor body.

17. The transistor of claim 16 wherein the second gate structure adjacent to the second vertical edge of the transistor body has a work function which is more attractive to the dominant charge carriers of the transistor compared to that of the second gate structure adjacent to the first vertical edge of the transistor body.

18. A transistor comprising:
- a) a fin body formed on a substrate, the fin body having a first vertical edge and a second vertical edge, and a first end and a second end;
- b) a source formed at the first end of the fin body, and a drain formed at the second end of the fin body;
- c) a first gate structure adjacent the transistor body first vertical edge and second vertical edge, the first gate structure approximate to the source; and
- d) a second gate structure adjacent the transistor body first vertical edge and second vertical edge, the second gate structure approximate to the drain, wherein an edge of the first gate structure adjacent to the first vertical edge of the transistor body is opposite, and displaced less than the body thickness from an edge of the second gate structure adjacent to the second vertical edge of the transistor body.

\* \* \* \* \*